(12) United States Patent
Song

(10) Patent No.: US 10,892,417 B2
(45) Date of Patent: Jan. 12, 2021

(54) SUBSTRATE, DISPLAY DEVICE, CONDUCTIVE FILM WITH DOPANT AND METHOD FOR FABRICATING THE SAME

(71) Applicant: BOE TECHNOLOGY GROUP CO., LTD., Beijing (CN)

(72) Inventor: Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/484,104

(22) PCT Filed: Nov. 29, 2018

(86) PCT No.: PCT/CN2018/118261
§ 371 (c)(1),
(2) Date: Aug. 6, 2019

(87) PCT Pub. No.: WO2019/114560
PCT Pub. Date: Jun. 20, 2019

(65) Prior Publication Data
US 2019/0355907 A1    Nov. 21, 2019

(30) Foreign Application Priority Data
Dec. 15, 2017 (CN) .......................... 2017 1 1352144

(51) Int. Cl.
*H01L 51/00* (2006.01)
*H01L 51/52* (2006.01)
*H01L 51/56* (2006.01)

(52) U.S. Cl.
CPC .......... *H01L 51/0034* (2013.01); *H01L 51/52* (2013.01); *H01L 51/56* (2013.01)

(58) Field of Classification Search
CPC ..... H01L 51/0034; H01L 51/52; H01L 51/56; H01L 51/5206; H01L 51/5088; H01L 51/0037; H01L 51/0021
(Continued)

(56) References Cited

U.S. PATENT DOCUMENTS 5,812,367 A * 9/1998 Kudoh ................ H01G 9/0036
361/523
2007/0131914 A1 6/2007 Elschner et al.
(Continued)

FOREIGN PATENT DOCUMENTS

CN  1983661 A  6/2007
CN  102800809 A  11/2012
(Continued)

OTHER PUBLICATIONS

Lee et al., "Simultaneously Enhancing the Cohesion and Electrical Conductivity of PEDOT:PSS Conductive Polymer Films using DMSO Additives," Applied Materials and Interfaces, vol. 8 (2016) pp. 302-310.
(Continued)

*Primary Examiner* — Mohammad M Hoque
(74) *Attorney, Agent, or Firm* — McDermott Will & Emery LLP

(57) ABSTRACT

A substrate includes a base substrate and a conductive pattern disposed on the base. A material of the conductive pattern includes a second conductive polymer and a dopant. The second conductive polymer is a conductive polymer transformed from a first conductive polymer under an action of the dopant. A conductivity of the second conductive polymer is greater than a conductivity of the first conductive polymer.

7 Claims, 2 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2008/0105870 | A1* | 5/2008 | Yu | ........................... H01L 29/22 |
| | | | | 257/49 |
| 2012/0298974 | A1 | 11/2012 | Lee et al. | |
| 2014/0098458 | A1* | 4/2014 | Almadhoun | ............. C08K 9/02 |
| | | | | 361/305 |
| 2015/0041782 | A1 | 2/2015 | Chery et al. | |
| 2017/0288169 | A1* | 10/2017 | Ito | ......................... H01J 37/244 |

FOREIGN PATENT DOCUMENTS

| | | |
|---|---|---|
| CN | 103665405 A | 3/2014 |
| CN | 104137291 A | 11/2014 |
| CN | 105914047 A | 8/2016 |
| CN | 106340598 A | 1/2017 |

OTHER PUBLICATIONS

International Search Report and Written Opnion issued in corresponding PCT/CN2018/118261, dated Feb. 27, 2019, with English translation.
First Office Action issued in corresponding Chinese Application No. 201711352144.3, dated Oct. 22, 2019, with English translation.

* cited by examiner

SUBSTRATE, DISPLAY DEVICE, CONDUCTIVE FILM WITH DOPANT AND METHOD FOR FABRICATING THE SAME

CROSS-REFERENCE TO RELATED APPLICATION

This application is a national phase entry under 35 USC 371 of International Patent Application No. PCT/CN2018/118261 filed on Nov. 29, 2018, which claims priority to Chinese Patent Application No. 201711352144.3, filed with the Chinese Patent Office on Dec. 15, 2017, titled "A SUBSTRATE, DISPLAY DEVICE, AND MANUFACTURING METHOD FOR CONDUCTIVE THIN FILM", which are incorporated herein by reference in their entirety.

TECHNICAL FIELD

The present disclosure relates to the field of display technologies, and more particularly, to a substrate, a display device, a conductive film and a method for fabricating the same.

BACKGROUND

With the continuous advancement of technology, a variety of electronic products have gradually entered people's lives, and electrodes play a vital role in the electronic products.

SUMMARY

Some embodiments of the present disclosure provide a substrate. The substrate includes a base substrate and a conductive pattern disposed on the base substrate. A material of the conductive pattern includes a second conductive polymer and a dopant. The second conductive polymer is a conductive polymer transformed from a first conductive polymer under an action of the dopant. A conductivity of the second conductive polymer is greater than a conductivity of the first conductive polymer.

In some embodiments, the conductive pattern includes a plurality of layers of sub-conductive patterns that are stacked. A material of each of the plurality of layers of sub-conductive patterns includes the second conductive polymer and the dopant.

In some embodiments, among the plurality of layers of sub-conductive patterns, materials of at least two adjacent layers of sub-conductive patterns are not completely the same.

In some embodiments, the conductive pattern includes at least one layer of first sub-conductive pattern and at least one layer of second sub-conductive pattern, and each of the at least one layer of first sub-conductive pattern and each of the at least one layer of second sub-conductive pattern are alternately disposed. A material of each of the at least one layer of first sub-conductive pattern is the same, and a material of each of the at least one layer of second sub-conductive pattern is the same. The material of the first sub-conductive pattern and the material of the second sub-conductive pattern contain a same second conductive polymer and different dopants.

In some embodiments, the material of the first conductive polymer is selected from at least one of poly(3,4-ethylenedioxythiophene) (PEDOT), polythiophene, polypyrrole, polyaniline, and polyphenylene.

In some embodiments, a material of the dopant is selected from at least one of polyvinyl alcohol (PVA) and dimethyl sulfoxide (DMSO).

In some embodiments, in a case where the dopant includes the polyvinyl alcohol (PVA), a ratio of PVA to the material of the conductive pattern is 0.01 wt % to 1 wt %; and in a case where the dopant includes the dimethyl sulfoxide (DMSO), a ratio of DMSO to the material of the conductive pattern is 0.01 wt % to 6 wt %.

In some embodiments, the material of the conductive pattern further includes a solubilizer.

In some embodiments, a material of the solubilizer includes poly(styrene sulfonate) (PSS).

Some embodiments of the present disclosure provide a display device, which includes the substrate described above.

In some embodiments, the display device is an organic electroluminescent display (OELD) device; and a base substrate of the substrate is a flexible base substrate.

Some embodiments of the present disclosure provide a method of fabricating a conductive film. The method includes: making a surface of a base substrate on which films are to be formed positively or negatively charged; immersing the base substrate in a mixed solution for a period of time, taking out the base substrate from the mixed solution and drying the base substrate, so as to form a layer of sub-conductive film on the surface of the base substrate on which films are to be formed, the mixed solution including a second conductive polymer and a dopant, and the second conductive polymer being a conductive polymer transformed from a first conductive polymer under an action of the dopant; repeating a process of immersing the base substrate formed with a layer of sub-conductive film in the mixed solution for a period of time, taking out the base substrate from the mixed solution and drying the base substrate at least once; and forming a plurality of layers of sub-conductive films on the base substrate through the above steps, the plurality of layers of sub-conductive films constituting the conductive film.

In some embodiments, among mixed solutions in which the base substrate is immersed a plurality of times, at least two mixed solutions are not completely the same.

In some embodiments, the mixed solutions in which the base substrate is immersed a plurality of times include a first mixed solution and a second mixed solution. The first mixed solution is a mixed solution in which the base substrate is immersed at an odd-number-th time, and the second mixed solution is a mixed solution in which the base substrate is immersed at an even-number-th time. The first mixed solution and the second mixed solution contain a same second conductive polymer and different dopants.

In some embodiments, the mixed solution further includes a solubilizer.

In some embodiments, the step of making a surface of a base substrate on which films are to be formed positively or negatively charged, includes: treating the surface of the base substrate on which films are to be formed, such that the surface of the base substrate on which films are to be formed has a positive or negative charge.

In some embodiments, the step of treating the surface of the base substrate on which films are to be formed, includes: performing plasma treatment or electrochemical treatment on the surface of the substrate on which films are to be formed.

In some embodiments, the period of time is 20 to 30 minutes.

In some embodiments, the first conductive polymer has a benzenoid structure, and the second conductive polymer has a quinoid structure.

Some embodiments of the present disclosure further provide a conductive film, the conductive film is fabricated by the method of fabricating a conductive film described above.

BRIEF DESCRIPTION OF THE DRAWINGS

In order to describe technical solutions in embodiments of the present disclosure or in the related art more clearly, the accompanying drawings to be used in the description of embodiments or the prior art will be introduced briefly. Obviously, the accompanying drawings described below are merely some embodiments of the present disclosure. For a person of ordinary skill in the art, other drawings may be obtained according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Herein, a flexible organic electroluminescent display (OELD) device is taken as an example. The flexible OELD device includes anodes, light-emitting layers and cathodes. When fabricating the anodes, a conductive film such as an indium tin oxide (ITO) film or an indium zinc oxide (IZO) film is generally formed on a flexible base substrate by a sputtering process, and the anodes are formed 10 by patterning the conductive film. In this method of forming the conductive film by the sputtering process, it is difficult to control doping ratios of various elements such as In(indium) and Zn (zinc). Therefore, it is difficult to control a morphology of a film and a transport performance of carriers of the film. In a case where the sputtering process is a low-temperature sputtering process, since a bonding force between a conductive film formed by a low-temperature sputtering technique and the flexible base substrate is not strong, bonding forces between the anodes and the flexible base substrate are also not strong. As a result, in the flexible OELD device, the anodes may easily fall off from the flexible base substrate during a process in which the display device is repeatedly bent. Consequently, a luminescence stability of the flexible OELD device is affected.

Based on this, in the related art, a composite material of poly(3,4-ethylenedioxythiophene):poly(styrene sulfonate) (PEDOT:PSS) is used to form a new conductive film. With this material, a film can be formed by printing, spin coating, etc. A film formed of this material is bendable and can be firmly bonded to the flexible base substrate. Thus, the film will not easily fall off during the process in which the display device is repeatedly bent. However, due to a high resistance of the PEDOT:PSS composite material, that is, a high resistance of the anodes formed of the composite material of PEDOT:PSS, a luminescence efficiency of the display device is seriously affected.

Figure 1:
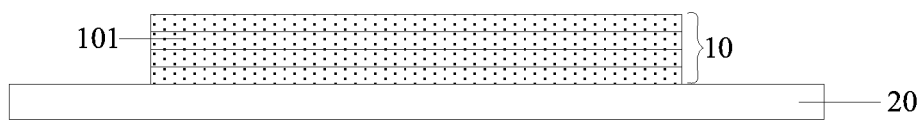
FIG. 1 is a schematic diagram showing a structure of a substrate, in accordance with some embodiments of the present disclosure.

Some embodiments of the present disclosure provide a substrate. As shown in FIG. 1, the substrate includes a base substrate 20 and a conductive pattern 10 disposed on the base substrate 20. The base substrate 20 is a substrate body, or, the base substrate 20 includes a substrate body and other layer(s) formed on the substrate body such as a planarization layer. A material of the conductive pattern 10 includes a second conductive polymer and a dopant. The second conductive polymer is formed by adding the dopant to a first conductive polymer to transform a structure of the first conductive polymer by the dopant. A conductivity of the second conductive polymer is greater than a conductivity of the first conductive polymer.

The conductive pattern 10 is formed by, for example, forming a conductive film first, and then patterning the conductive film. In some embodiments, the conductive pattern 10 is used as electrodes. In some embodiments, the conductive pattern 10 includes a plurality of layers of sub-conductive patterns 101 that are stacked. A material of each of the plurality of layers of sub-conductive patterns 101 includes the second conductive polymer and the dopant. The second conductive polymer is formed by adding the dopant to the first conductive polymer to transform the structure of the first conductive polymer by the dopant.

Since a thickness of a single layer of sub-conductive pattern 101 is small, thus, as an implementable manner, the conductive pattern 10 is made to include a plurality of layers of sub-conductive patterns 101. A number of layers of the plurality of layers of sub-conductive patterns 101 included in the conductive pattern 10 is not limited, and may be set according to a required thickness of the conductive pattern 10 and a thickness of each sub-conductive pattern 101.

Figure 2:
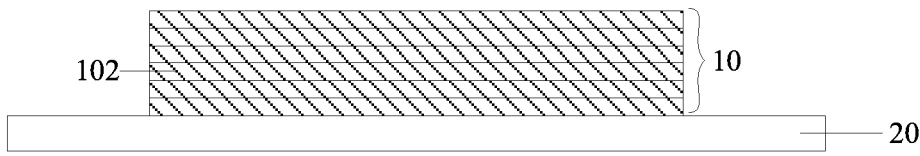
FIG. 2 is a schematic diagram showing another structure of a substrate, in accordance with some embodiments of the present disclosure.

Based on the above, in some embodiments, a material of each of the plurality of layers of sub-conductive patterns 101 is completely the same. That is, as shown in FIG. 2, the conductive pattern 10 includes a plurality of layers of first sub-conductive patterns 102, and a material of each of the plurality of layers of first sub-conductive patterns 102 is completely the same. In some other embodiments, among the plurality of layers of sub-conductive patterns, materials of at least two adjacent layers of sub-conductive patterns are not completely the same.

The description that among the plurality of layers of sub-conductive patterns, materials of at least two adjacent layers of sub-conductive patterns are not completely the same, means that, for example: in some layers of the plurality of layers of sub-conductive patterns, materials of any two adjacent layers of sub-conductive patterns 101 are not completely the same; and in other layers, a material of each of the other layers of sub-conductive patterns 101 is the same as a material of one layer in the some layers of sub-conductive patterns 101. The description that among the plurality of layers of sub-conductive patterns, materials of at least two adjacent layers of sub-conductive patterns are not completely the same, means that, for another example: materials of the plurality of layers of sub-conductive patterns 101 are all different from each other.

Herein, in a case where among the plurality of layers of sub-conductive patterns, materials of at least two adjacent layers of sub-conductive patterns are not completely the same, the materials of the two layers of sub-conductive patterns 101 contain at least one of different second conductive polymers and different dopants. In some embodiments, the materials of the two layers of sub-conductive patterns 101 contain a same second conductive polymer and different dopants. In some other embodiments, the materials of the two layers of sub-conductive patterns 101 contain a same dopant but different second conductive polymers. In some yet other embodiments, the materials of the two layers of sub-conductive patterns 101 contain different second conductive polymers and different dopants.

A material of the first conductive polymer is not limited. For example, the material of the first conductive polymer is selected from at least one of poly(3,4-ethylenedioxythiophene) (PEDOT), polythiophene, polypyrrole, polyaniline, and polyphenylene. Since PEDOT has a characteristics of simple molecular structure, small energy gap, high conductivity, etc., in some embodiments of the present disclosure, the material of the first conductive polymer is PEDOT. The PEDOT is a polymer of 3,4-ethylenedioxythiophene (EDOT) thiophene monomers.

A material of the dopant is not limited, as long as after the dopant is added to a solution including the first conductive polymer, the structure of the first conductive polymer can be transformed to obtain a second conductive polymer, and the conductivity of the second conductive polymer is greater than the conductivity of the first conductive polymer. For example, the material of the dopant is selected from at least one of polyvinyl alcohol (PVA) and dimethyl sulfoxide (DMSO).

In some embodiments, the material of each of the plurality of layers of sub-conductive patterns 101 includes other materials in addition to the second conductive polymer and the dopant, which is not limited thereto.

It is not limited what structure the dopant transforms the structure of the first conductive polymer into, as long as after transformation, the conductivity of the second conductive polymer is greater than the conductivity of the first conductive polymer. For example, the dopant transforms a benzenoid structure

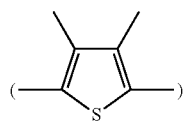

of the first conductive polymer into a quinoid structure

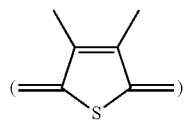

of the second conductive polymer. A detailed description is given below by taking an example in which the material of the first conductive polymer is PEDOT. Referring to Equation (1), a molecular structure of PEDOT before doping is as shown in (a) of Equation (1), and a molecular structure of PEDOT after adding the dopant to the PEDOT (i.e., the transformed PEDOT) is as shown in (b) of Equation (1).

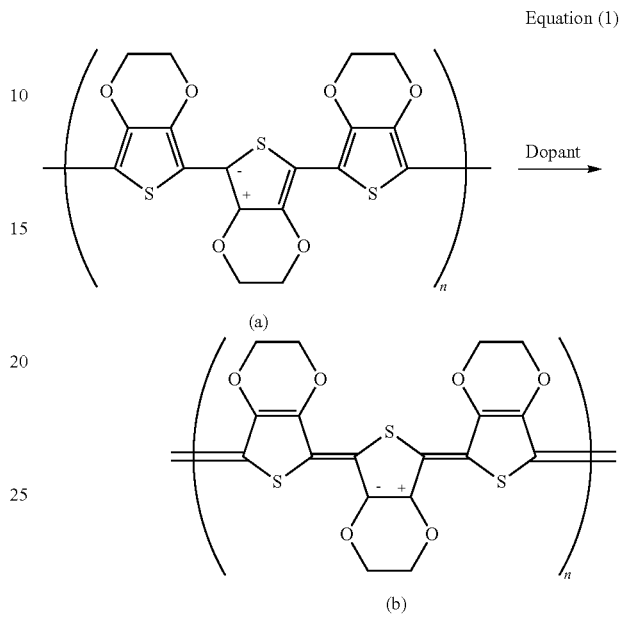

Equation (1)

Referring to Equation (1), after adding the dopant to the PEDOT, the molecular structure of the PEDOT is transformed from the benzenoid structure to the quinoid structure. The linearly conjugated quinoid structure makes double bonds in the molecular structure of the PEDOT orderly arranged, thereby improving an orderliness of molecules in transformed PEDOT, and thus increasing a conductivity of the transformed PEDOT in the conductive pattern 10.

It will be noted that the above description is made by only taking an example in which the material of the first conductive polymer is the PEDOT. As for other first conductive polymers, after the dopant is added, it is not limited that the dopant improves the conductivity of the second conductive polymer only by transforming the benzenoid structure into the quinoid structure. According to a molecular structure of a polymer, in some embodiments, after the dopant is added, an orderliness of the molecules of the first conductive polymer may be improved by other means.

In the substrate provided by the embodiments of the present disclosure, the conductive pattern 10 includes the dopant in addition to the second conductive polymer; the dopant is able to transform the structure of the first conductive polymer to obtain the second conductive polymer and thus improve the orderliness of the molecules of the transformed second conductive polymer; and improvement of the orderliness of the molecules of the second conductive polymer may enhance a hopping mobility of the carriers, and increase a rigidity and degree of conjugation of molecular chains. Therefore, the conductivity of the second conductive polymer may be increased (generally, the conductivity of the second conductive polymer is increased by dozens or hundreds of times from the conductivity of the first conductive polymer), and thus the conductivity of the conductive pattern 10 may be increased. In a case where the conductive pattern 10 is used as electrodes such as anodes, since the conductivity of the conductive pattern 10 added with the dopant provided by embodiments of the present disclosure is improved, a resistance of the electrodes is reduced.

Figure 3:
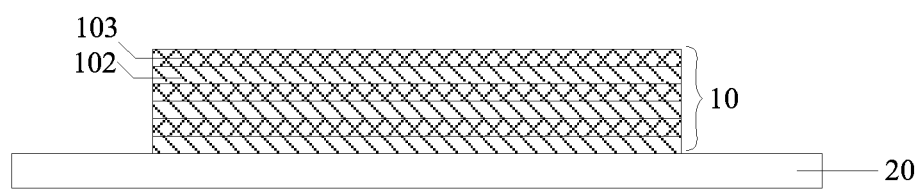
FIG. 3 is a schematic diagram showing yet another structure of a substrate, in accordance with some embodiments of the present disclosure.

In some embodiments, as shown in FIG. 3, the conductive pattern 10 includes at least one layer of first sub-conductive pattern 102 and at least one layer of second sub-conductive pattern 103. Each of the at least one layer of first sub-conductive pattern 102 and each of the at least one layer of second sub-conductive pattern 103 are alternately disposed. A material of the at least one layer of first sub-conductive pattern and a material of the at least one layer of second sub-conductive pattern contain a same second conductive polymer and different dopants.

In the conductive pattern 10, the material of each of the at least one layer of first sub-conductive pattern 102 is the same, and the material of each of the at least one layer of second sub-conductive pattern 103 is the same.

The use of dopant in each sub-conductive pattern of the plurality of layers of sub-conductive patterns 101 may reduce a degree of smoothness of each sub-conductive pattern. Therefore, in some embodiments of the present disclosure, each of the at least one layer of first sub-conductive pattern 102 and each of the at least one layer of second sub-conductive pattern 103 are alternately disposed. Based on this, since the material of each layer of first sub-conductive pattern and the material of each layer of second sub-conductive pattern contain the same second conductive polymer and different dopants, an alternate use of the dopants may improve the degree of smoothness of the conductive pattern 10 formed in the end.

In a case where the material of each of the plurality of layers of sub-conductive patterns 101 includes both a second conductive polymer and a dopant, a doping ratio of the dopant is not limited, and may be appropriately set as needed. If the doping ratio of the dopant is too small, the orderliness of the molecules of the second conductive polymer may not be improved significantly, and the conductivity of the conductive pattern 10 may not change significantly. If the doping ratio is too large, since the dopant itself is not electrically conductive, the conductivity of the material including the dopant and the second conductive polymer may be affected. Based on this, in some embodiments, the dopant is PVA, and the doping ratio of PVA is 0.01 wt % to 1 wt %. That is, in each layer of sub-conductive pattern of the plurality of layers of sub-conductive patterns 101, a ratio of a mass of PVA to a sum of a mass of all constituents in the layer of sub-conductive pattern is 0.01 wt % to 1 wt %. In some other embodiments, the dopant is DMSO, and the doping ratio of DMSO is 0.01 wt % to 6 wt %. That is, in each layer of sub-conductive pattern of the plurality of layers of sub-conductive patterns 101, a ratio of a mass of DMSO to a sum of a mass of all constituents in the layer of sub-conductive pattern is 0.01 wt % to 6 wt %.

Since a solubility of the second conductive polymer is poor, in some embodiments, the material of the conductive pattern 10 further includes a solubilizer for increasing the solubility of the second conductive polymer.

In some embodiments, in a case where the conductive pattern 10 includes a plurality of layers of sub-conductive patterns 101, the material of each of the plurality of layers of sub-conductive patterns 101 includes a solubilizer.

A material of the solubilizer is not limited, as long as the solubility of the second conductive polymer can be increased. Addition of the solubilizer to a solution including the second conductive polymer may significantly increase the solubility of the second conductive polymer. For example, the material of the solubilizer is poly(styrene sulfonate) (PSS).

Based on the above, in some embodiments, the material of at least one layer of sub-conductive pattern of the plurality of layers of sub-conductive patterns 101 is the transformed PEDOT:PSS/PVA. In some other embodiments, the material of at least one layer of sub-conductive pattern of the plurality of layers of sub-conductive patterns 101 is the transformed PEDOT:PSS/DMSO.

Figure 4:
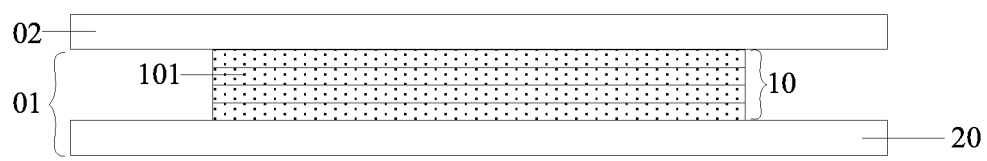
FIG. 4 is a schematic diagram showing a structure of a display device, in accordance with some embodiments of the present disclosure.

Some embodiments of the present disclosure provide a display device. As shown in FIG. 4, the display device includes the substrate described above.

FIG. 4 shows an example in which the display device is an OELD device. The display device in FIG. 4 includes an array substrate 01 and an encapsulating substrate 02. The substrate described above is the array substrate 01. FIG. 4 only shows the conductive pattern 10 of the array substrate, and does not show other layers.

In some embodiments of the present disclosure, the display device is a liquid crystal display (LCD) device. The LCD device includes an array substrate, an opposite substrate, and a liquid crystal layer disposed between the array substrate and the opposite substrate. In some embodiments, the substrate described above is the array substrate in the LCD device. In some other embodiments, the substrate described above is the opposite substrate in the LCD device.

In some other embodiments of the present disclosure, the display device is an OELD device. The OELD device includes an array substrate and an encapsulating substrate. The array substrate includes thin film transistors, anodes, light-emitting functional layers, and cathodes. The encapsulating substrate is an encapsulating cover or an encapsulating film. In some embodiments, the substrate described above is the array substrate in the OELD device. In some other embodiments, the substrate described above is the encapsulating cover in the OELD device.

In some embodiments, the conductive pattern 10 in the substrate is used as electrodes in the display device.

The display device provided by embodiments of the present disclosure may be any device that displays a moving image (e.g., video) or a fixed image (e.g., still image). The image is a text or a picture. More specifically, it is contemplated that the described embodiments may be implemented in or associated with various electronic devices. The various electronic devices include, for example, but are not limited to, mobile phones, wireless devices, personal digital assistants (PDAs), handheld or portable computers, GPS receivers/navigators, cameras, MP4 video players, video cameras, game consoles, watches, clocks, calculators, television monitors, flat panel displays, computer monitors, car displays (e.g., odometer displays, etc.), navigators, cockpit controllers and/or displays, camera view displays (e.g., rear view camera displays in vehicles), electronic photos, electronic billboards or signages, projectors, architectural structures, packaging and aesthetic structures (e.g., displays for images of a piece of jewelry).

In addition, in some embodiments, the display device is a display panel.

In the display device provided by the embodiments of the present disclosure, the display device includes the substrate described above. The material of the conductive pattern 10 includes a dopant in addition to the second conductive polymer; the dopant is able to transform the structure of the first conductive polymer to obtain the second conductive polymer and thus improve the orderliness of the molecules of the transformed second conductive polymer; and improvement of the orderliness of the molecules of the second conductive polymer may enhance a hopping mobility of the carriers, and increase a rigidity and degree of conjugation of molecular chains. Therefore, the conductivity of the second conductive polymer may be increased, and thus the conductivity of the conductive pattern 10 may be increased. In the case where the conductive pattern 10 is used as electrodes such as anodes, since the conductivity of the conductive pattern 10 added with the dopant provided by embodiments of the present disclosure is improved, the resistance of the electrodes in the display device is reduced.

In some embodiments, in a case where the display device is an OELD device, the substrate is a flexible substrate.

In a case where the substrate is a flexible substrate, the display device is a flexible display device.

In some embodiments, the conductive pattern 10 in the substrate is used as anodes or cathodes of the OELD device.

Since the material of the conductive pattern 10 in the substrate includes the second conductive polymer and the dopant, and the second conductive polymer is an organic material, the conductive pattern 10 may be firmly bonded to the base substrate 20 that is in contact with the conductive pattern 10. Therefore, the conductive pattern 10 may be prevented from falling off during the process in which the display device is repeatedly bent. In addition, the dopant is added to the first conductive polymer, and the dopant transforms the structure of the first conductive polymer to obtain the second conductive polymer, thereby increasing conductivities of both the second conductive polymer and the conductive pattern 10. Thus, in the case where the conductive pattern 10 is used as electrodes of the OELD device, the resistance of the electrodes may be reduced, and a luminescence efficiency of the OELD device may be improved.

Figure 5:
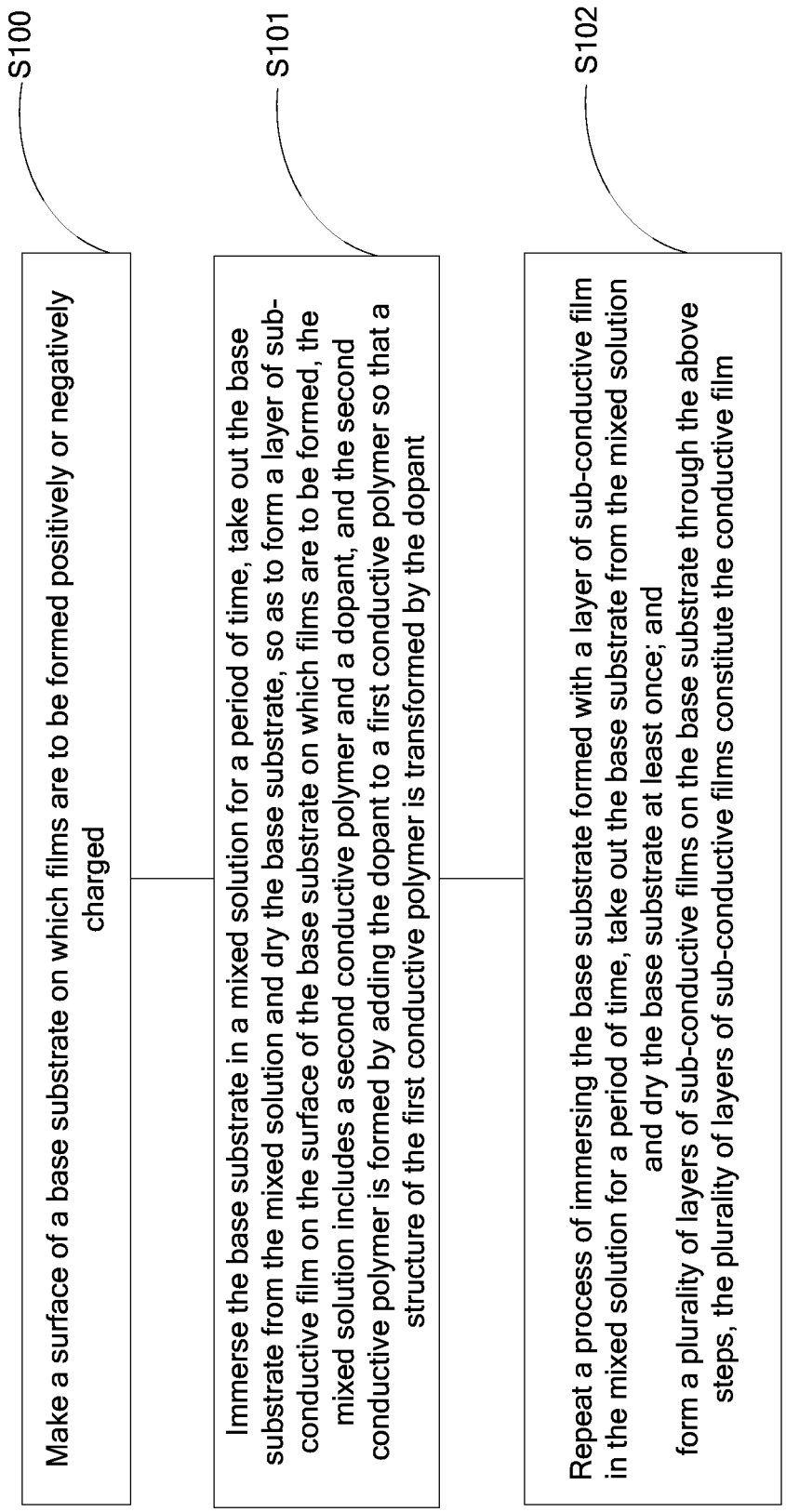
FIG. 5 is a flow chart of a method of fabricating a conductive film, in accordance with some embodiments of the present disclosure.

Some embodiments of the present disclosure provide a method of fabricating a conductive film. As shown in FIG. 5, the method includes step 100~step 102 (S100~S102).

In S100, a surface of a base substrate on which films are to be formed is made to be positively or negatively charged.

In some embodiments, the base substrate includes a substrate body and other layer(s) formed on the substrate body such as a planarization layer. In this case, a surface of the substrate body on which films are to be formed has positive or negative charges. In some other embodiments, the base substrate is a substrate body. In this case, the surface of the substrate body on which films are to be formed has positive or negative charges.

In S101, the base substrate is immersed in a mixed solution for a period of time, and then the base substrate is taken out from the mixed solution and dried, so as to form a layer of sub-conductive film on the surface of the base substrate on which films are to be formed. The mixed solution includes a second conductive polymer and a dopant. The second conductive polymer is formed by adding the dopant to a first conductive polymer to transform a structure of the first conductive polymer by the dopant.

Herein, a duration of the period of time for immersing the base substrate in the mixed solution is not limited. If the period of time of immersing the substrate in the mixed solution is too short, it may be impossible to form a layer of sub-conductive film on the surface of the base substrate on which films are to be formed. If the period of time of immersing the base substrate in the mixed solution is too long, a fabrication efficiency of the conductive film may be affected. Therefore, in some embodiments of the present disclosure, the period of time is 20 to 30 minutes.

The drying process is for evaporating a solvent in the mixed solution, so as to form a layer of sub-conductive film on the surface on which films are to be formed. Based on this, a method of drying is not limited, for example, by hot air drying, natural drying, or drying in the sun.

It will be noted that, a material of the first conductive polymer is not limited. For example, the material of the first conductive polymer is selected from at least one of PEDOT, polythiophene, polypyrrole, polyaniline, and polyphenylene. Since PEDOT has a characteristics of simple molecular structure, small energy gap, high conductivity, etc., in some embodiments of the present disclosure, the material of the first conductive polymer is PEDOT. PEDOT is a polymer of EDOTs.

A material of the dopant is not limited, as long as after the dopant is added to a solution including the first conductive polymer, the structure of the first conductive polymer can be transformed, the orderliness of molecules of the second conductive polymer can be improved, and thus the conductivity of the second conductive polymer can be increased. For example, the material of the dopant is selected from at least one of PVA and DMSO.

In some embodiments, the mixed solution includes a solvent such as water or alcohol in addition to the second conductive polymer and the dopant. A fabricating process of the mixed solution is as follows: a solution containing the first conductive polymer is formed first, and then a dopant is added to the solution to form a mixed solution. For example, a solution containing PEDOT is formed first, and then PVA is doped in the PEDOT solution to form a transformed PEDOT/PVA mixed solution. The second conductive polymer formed by transforming the structure of the first conductive polymer mainly conducts electricity in the mixed solution, so a content of the second conductive polymer in the mixed solution should be properly controlled. In some embodiments, the content of the second conductive polymer in the mixed solution is 1 mg/ml.

In S102, the process of immersing the base substrate formed with a layer of sub-conductive film in the mixed solution for a period of time, taking out the base substrate from the mixed solution and drying the base substrate, is repeated at least once, so as to form a plurality of layers of sub-conductive films on the base substrate. The plurality of layers of sub-conductive films constitute the conductive film. In some embodiments, mixed solutions in which the base substrate is immersed a plurality of times are completely the same. In some other embodiments, among the mixed solutions in which the base substrate is immersed a plurality of times, at least two mixed solutions are not completely the same.

The number of repetitions is not limited, and may be set according to a required thickness of the conductive film and a thickness of each sub-conductive film that is formed. Herein, the process is repeated n times, therefore the conductive film includes n+1 layers of sub-conductive films; and n is a positive integer. Since a thickness of a single layer of sub-conductive film is small, it is difficult for the single layer of sub-conductive film to be separately applied in a product in actual production. Thus, as an implementable manner, the conductive film is made to include a plurality of layers of sub-conductive films.

The description that among the mixed solutions in which the base substrate is immersed a plurality of times, at least two mixed solutions are not completely the same, means that, for example: at least two mixed solutions of the mixed solutions in which the base substrate is immersed a plurality of times are different, and each of other mixed solutions in which the base substrate is immersed is the same as one of the at least two mixed solutions. In some other embodiments, the description that among the mixed solutions in which the base substrate is immersed a plurality of times, at least two mixed solutions are not completely the same, means that, for another example: among the mixed solutions in which the base substrate is immersed a plurality of times, each mixed solution is different. Herein, the description that at least two mixed solutions are not completely the same, means that the two mixed solutions contain at least one of different second conductive polymers and different dopants.

Based on this, after the conductive film is formed, the conductive film is patterned to form a conductive pattern.

Based on S100~S102 described above, the technique of immersing the base substrate in the mixed solution to fabricate a conductive film on the surface of the base substrate on which films are to be formed, is referred to as a self-assembly technique. Films formed through the self-assembly technique are highly ordered, dense, and flat. Different forces between materials such as intermolecular forces and electrostatic adsorption are used to construct layered and ordered nanostructures. Ordered distribution of molecular chains of the second conductive polymer in the layered and ordered nanostructures may enhance the hopping mobility of the carriers. Moreover, the rigidity and the degree of conjugation of the molecular chains are high in layered and ordered nano-structures. Therefore, the formed conductive films have a high conductivity. In some embodiments of the present disclosure, layered and ordered conductive films are fabricated through the self-assembly technique. And by using the mixed solution containing the dopant, the orderliness of the conductive films fabricated by the self-assembly technique is further improved, and the conductivity of the conductive films are significantly increased.

In the method of fabricating the conductive film provided by embodiments of the present disclosure, in the process of forming each layer of sub-conductive film of the plurality of layers of sub-conductive films, the base substrate is immersed in the mixed solution. Since the mixed solution includes a dopant in addition to the first conductive polymer, and the dopant may transform the structure of the first conductive polymer to obtain the second conductive polymer, the orderliness of the molecules of the second conductive polymer may be improved. And since the improvement of the orderliness of the molecules of the second conductive polymer may enhance the hopping mobility of the carriers, and increase the rigidity and the degree of conjugation of the molecular chains, the conductivity of each layer of sub-conductive film may be improved, and thus the conductivity of the formed conductive film may be improved. In a case where the conductive film provided by embodiments of the present disclosure is patterned to form electrodes such as anodes, since the conductivity of the conductive film provided by embodiments of the present disclosure is high, the resistance of the electrodes may be reduced.

In some embodiments, the mixed solutions in which the base substrate is immersed a plurality of times include a first mixed solution and a second mixed solution. The first mixed solution is a mixed solution in which the base substrate is immersed at an odd-number-th time, and the second mixed solution is a mixed solution in which the base substrate is immersed at an even-number-th time. The first mixed solution and the second mixed solution contain a same second conductive polymer and different dopants.

Since the mixed solutions in which the base substrate is immersed at odd-number-th time(s) are the same, and the mixed solutions in which the base substrate is immersed at even-number-th time(s) are the same, each of at least one layer of sub-conductive film formed at odd-number-th time(s) is made of a same material, and each of at least one layer of sub-conductive film formed at even-number-th time(s) is made of a same material.

The use of dopant in the mixed solutions may reduce a degree of smoothness of each sub-conductive film. Therefore, in some embodiments of the present disclosure, the first mixed solution in which the base substrate is immersed at an odd-number-th time and the second mixed solution in which the base substrate is immersed at an even-number-th time contain the same second conductive polymer and different dopants. Based on this, an alternate use of the dopants may improve the degree of smoothness of the conductive film formed in the end.

Since a solubility of the second conductive polymer is poor, which means the second conductive polymer is not easily dissolved in the solvent, in some embodiments, the material of the mixed solution further includes a solubilizer for increasing the solubility of the second conductive polymer.

A material of the solubilizer is not limited, as long as the solubility of the second conductive polymer can be increased. An addition of the solubilizer to the solution of the second conductive polymer may significantly increase the solubility of the second conductive polymer. For example, the material of the solubilizer is PSS.

Based on the above, in some embodiments, the mixed solution includes the second conductive polymer (i.e., the transformed PEDOT), the solubilizer PSS, and the dopant PVA. In some other embodiments, the mixed solution includes the second conductive polymer (i.e., the transformed PEDOT), the solubilizer PSS and the dopant DMSO. For example, a fabricating process of the mixed solution is as follows: a solution containing PEDOT and PSS is formed first, and then PVA is doped to the PETOT:PSS solution, so as to form a mixed solution of the transformed PETOT:PSS/PVA.

An embodiment is provided below to explain in detail the method of fabricating a conductive film. Herein, the first mixed solution includes the transformed PEDOT, PSS, and PVA, and the second mixed solution includes the transformed PEDOT, PSS, and DMSO.

The base substrate with a surface on which films are to be formed that is positively charged or negatively charged is immersed in a transformed PEDOT:PSS/PVA mixed solution for 20 to 30 minutes, after which the base substrate is taken out from the transformed PEDOT:PSS/PVA mixed solution and dried, so as to form a first sub-conductive film on the surface of the base substrate on which films are to be formed. A material of the first sub-conductive film includes the transformed PEDOT, PSS, and PVA. The base substrate formed with the first sub-conductive film is immersed in a transformed PEDOT:PSS/DMSO mixed solution for 20 to 30 minutes, after which the base substrate is taken out from the transformed PEDOT:PSS/DMSO mixed solution and dried, so as to form a second conductive film on the first sub-conductive film. A material of the second sub-conductive film includes the transformed PEDOT, PSS and DMSO. Then, the base substrate formed with the first sub-conductive film and the second sub-conductive film is immersed in the transformed PEDOT:PSS/PVA mixed solution for 20 to 30 minutes, after which the base substrate is taken out from the transformed PEDOT:PSS/PVA mixed solution and dried, so as to form a third sub-conductive film on the second sub-conductive film. A material of the third sub-conductive film is the same as the material of the first sub-conductive film. Then, the base substrate formed with the first sub-conductive film, the second sub-conductive film, and the third sub-conductive film is immersed in the transformed PEDOT:PSS/DMSO mixed solution for 20 to 30 minutes, after which the base substrate is taken out from the transformed PEDOT:PSS/DMSO mixed solution and dried, so as to form a fourth sub-conductive film on the third sub-conductive film. A material of the fourth sub-conductive film is the same as the material of the second sub-conductive film. The above steps are repeated until a conductive film of a desired thickness is obtained.

In some embodiments, a method of making a surface of a base substrate on which films are to be formed positively or negatively charged, includes: treating the surface of the base substrate on which films are to be formed, such that the surface of the base substrate on which films are to be formed has positive or negative charges.

A manner in which the surface of the substrate on which films are to be formed is treated is not limited. For example, a plasma treatment or an electrochemical treatment is used. In some embodiments, the plasma treatment is an oxygen plasma treatment.

In some embodiments of the present disclosure, the surface of the base substrate on which films are to be formed is treated, such that the surface of the base substrate on which films are to be formed has positive or negative charges. In this way, after the base substrate is immersed into the mixed solution, a layer of sub-conductive film may be formed on the surface of the substrate on which films are to be formed.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A substrate, comprising a base substrate and a conductive pattern disposed on the base substrate, wherein
   a material of the conductive pattern includes a second conductive polymer and a dopant, and the second conductive polymer is a conductive polymer transformed from a first conductive polymer under an action of the dopant; and
   a conductivity of the second conductive polymer is greater than a conductivity of the first conductive polymer, wherein
   the conductive pattern includes at least one layer of first sub-conductive pattern and at least one layer of second sub-conductive pattern, and each of the at least one layer of first sub-conductive pattern and each of the at least one layer of second sub-conductive pattern are alternately disposed;
   a material of each of the at least one layer of first sub-conductive pattern is the same, and a material of each of the at least one layer of second sub-conductive pattern is the same;
   a material of the first sub-conductive pattern and the material of the second sub-conductive pattern contain a same second conductive polymer and different dopants, wherein
   a material of the first conductive polymer is selected from at least one of poly(3,4-ethylenedioxythiophene) (PEDOT), polythiophene, polypyrrole, polyaniline, and polyphenylene;
   a material of the dopant is selected from at least one of polyvinyl alcohol (PVA) and dimethyl sulfoxide (DMSO); and
   in a case where the dopant includes the polyvinyl alcohol (PVA), a ratio of PVA to the material of the conductive pattern is 0.01 wt % to 1 wt %.

2. The substrate according to claim 1, wherein among the plurality of layers of sub-conductive patterns, materials of at least two adjacent layers of sub-conductive patterns are not completely the same.

3. The substrate according to claim 1, wherein
   in a case where the dopant includes the dimethyl sulfoxide (DMSO), a ratio of DMSO to the material of the conductive pattern is 0.01 wt % to 6 wt %.

4. The substrate according to claim 1, wherein the material of the conductive pattern further includes a solubilizer.

5. The substrate according claim 4, wherein a material of the solubilizer includes poly(styrene sulfonate) (PSS).

6. A display device, comprising the substrate according to claim 1.

7. The display device according to claim 6, wherein the display device is an organic electroluminescent display (OELD) device; and a base substrate of the substrate is a flexible base substrate.

* * * * *